(12) United States Patent
Soucy et al.

(10) Patent No.: US 9,102,023 B2
(45) Date of Patent: Aug. 11, 2015

(54) CAT ARC PROCESS AND PART HOLDING APPARATUS

(71) Applicant: United Technologies Corporation, Hartford, CT (US)

(72) Inventors: Ronald R. Soucy, Tolland, CT (US); Dean Sirois, Enfield, CT (US); Prentice M. Sinesi, Cromwell, CT (US)

(73) Assignee: United Technologies Corporation, Hartford, CT (US)

( * ) Notice: Subject to any disclaimer, the term of this patent is extended or adjusted under 35 U.S.C. 154(b) by 231 days.

(21) Appl. No.: 13/714,944

(22) Filed: Dec. 14, 2012

(65) Prior Publication Data
US 2014/0165376 A1  Jun. 19, 2014

(51) Int. Cl.
*B23Q 3/00* (2006.01)
*C23C 14/04* (2006.01)
*C23C 14/32* (2006.01)

(52) U.S. Cl.
CPC ............... *B23Q 3/00* (2013.01); *C23C 14/042* (2013.01); *C23C 14/325* (2013.01); *Y10T 29/49998* (2015.01)

(58) Field of Classification Search
CPC ........ B25B 11/02; B25B 1/2484; B23Q 3/00; B23Q 3/06; B23Q 3/063
USPC .............. 269/9, 71, 75, 55, 900, 291, 271, 49
See application file for complete search history.

(56) References Cited

U.S. PATENT DOCUMENTS

| | | | | |
|---|---|---|---|---|
| 979,305 | A * | 12/1910 | Hunt | 269/9 |
| 4,209,166 | A * | 6/1980 | DeRouen | 269/71 |
| 5,984,160 | A * | 11/1999 | Santa Cruz et al. | 228/6.1 |
| 7,445,184 | B1 * | 11/2008 | Johnson | 248/176.1 |
| 7,448,606 | B1 * | 11/2008 | Johnson | 269/17 |
| 8,328,173 | B1 * | 12/2012 | DesForge et al. | 269/71 |
| 2008/0106020 | A1 * | 5/2008 | Sherlock | 269/71 |
| 2009/0026679 | A1 * | 1/2009 | Harman, III | 269/43 |
| 2014/0061413 | A1 * | 3/2014 | Bradfield | 248/229.1 |

* cited by examiner

*Primary Examiner* — Lee D Wilson
(74) *Attorney, Agent, or Firm* — Kinney & Lange, P.A.

(57) ABSTRACT

A device for holding parts while coating a portion of the part includes a holder tool having a plurality of holes for receiving a part and a part holding mask size to mask a portion of a part and having an extension sized to fit in one of the plurality of holes for receiving a part. The part holding mask has a pair of masking halves sized to hold the portion of the part exposing the portion of the part to be coated.

20 Claims, 6 Drawing Sheets

CAT ARC PROCESS AND PART HOLDING APPARATUS

BACKGROUND

Cathodic arc deposition (CAT ARC) or Arc-physical vapor deposition (Arc-PVD) is a physical vapor deposition technique in which an electric arc is used to vaporize material from a cathode target. The vaporized material then condenses on a substrate, forming a thin film. The technique can be used to deposit metallic, ceramic, and composite films.

The arc evaporation process begins with the striking of a high current, low voltage arc on the surface of a cathode (known as the target) that gives rise to a small (usually a few micrometers wide), highly energetic emitting area known as a cathode spot. The localized temperature at the cathode spot is extremely high (around 15,000° C.), which results in a high velocity (10 km/s) jet of vaporized cathode material, leaving a crater behind on the cathode surface. The cathode spot is only active for a short period of time, then it self-extinguishes and re-ignites in a new area close to the previous crater. This behavior causes the apparent motion of the arc.

As the arc is basically a current carrying conductor, it can be influenced by the application of an electromagnetic field, which in practice is used to rapidly move the arc over the entire surface of the cathode target, so that the total surface of the cathode surface is eroded over time.

The arc has an extremely high power density resulting in a high level of ionization (30-100%), multiple charged ions, neutral particles, clusters and macro-particles (droplets). If a reactive gas is introduced during the evaporation process, dissociation, ionization and excitation can occur during interaction with the ion flux and a compound film will be deposited.

Cathodic arc deposition is used in the production of coatings on gas turbine engine parts such as airfoil blades. Current practice is to use hardware such as fasteners to hold parts in place during the coating cycle, and has been limited to coating one blade at a time. Hardware needs to be cleaned after each use, adding to the time required to coat a part.

SUMMARY

Gas turbine engine parts such as airfoil blades are cathode arc coated using a tool that has the capacity to facilitate coating of more than one part at a time. The actual number of parts will depend on the quality of the cathodic arc coating process being used and other design considerations, Cathodic arc coating of two, three, four, five, six or more parts is contemplated.

The invention comprises the use of a mask that covers a first portion of the part not being coated while exposing a second portion to be coated. The mask has an extension that can be inserted into a holder tool for supporting the mask and the part during a coating process

DETAILED DESCRIPTION

Figure 1:
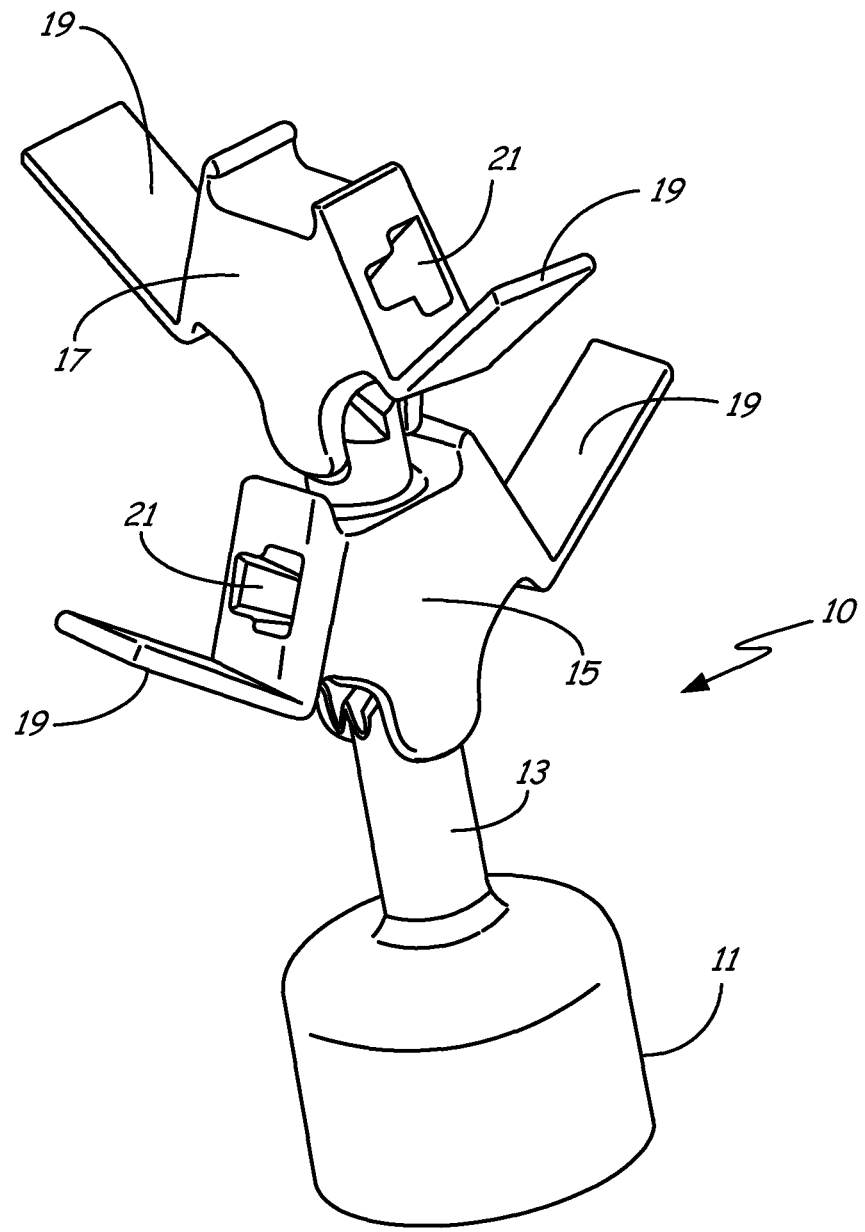
FIG. 1 is a perspective of a holding tool for use in a CAT ARC process.

FIG. 1 shows holder tool 10 with 11 base and post 13 supporting a first holder 15 and a second holder 17. Holders 15 and 17 each have two part holding portions, each comprising brackets 19 and two "T" shaped holes or receptacles 21.

Figure 2:
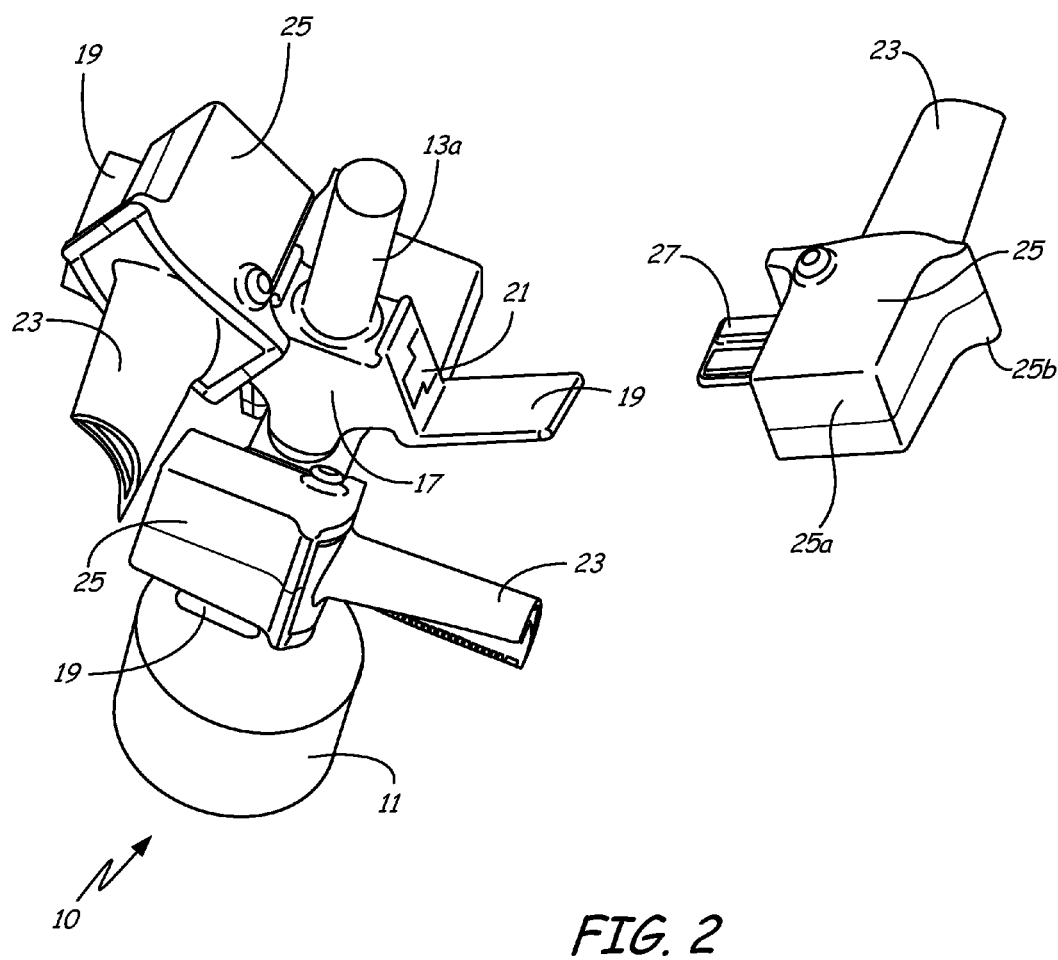
FIG. 2 is a perspective view of the holding tool of FIG. 1 holding three blades with associated masking devices and a fourth blade and masking device ready to be inserted.

FIG. 2 illustrates how the parts to be coated (which in this example are turbine blades 23) are attached to holder tool 10. Each blade 23 is held in blade masking tool 25 such that mask halves 25a and 25b enclose the portion of blade 23 that is not to be coated (in this example the root of blade 23). Extension 27 is also formed in blade masking tool 25 and is inserted into hole 21 such that it is stabilized by bracket 19. Three blades 23 have already been inserted into holder tool 10 using blade masking tools 25. Holder tool 10 has an extension of post 13a that can accommodate additional holders and thus coat a larger number of blades 23. When all of blades 23 are placed on holder tool 10, it is placed in a cathodic arc deposition device and coating of the exposed portions of blades 23 as desired.

Figure 3:
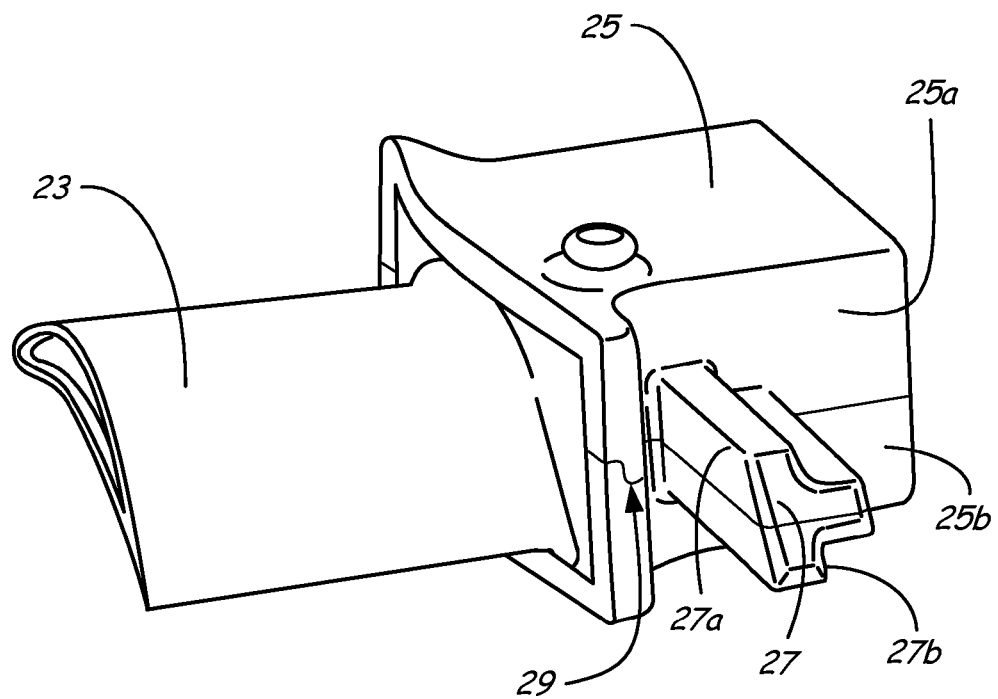
FIG. 3 is a perspective view showing a blade and masking device prior to attachment to the tool.

FIG. 3 shows blade 23 in blade masking tool 25 from a different perspective so that the two halves 27a and 27b of extension (or plug 27) are seen. Extension 27 is "T" shaped to prevent blade masking tool 25 from twisting or becoming misaligned as it sits on bracket 19 as seen in FIG. 2 both before and after blade tool masking 25 is placed on bracket 19.

Figure 4:
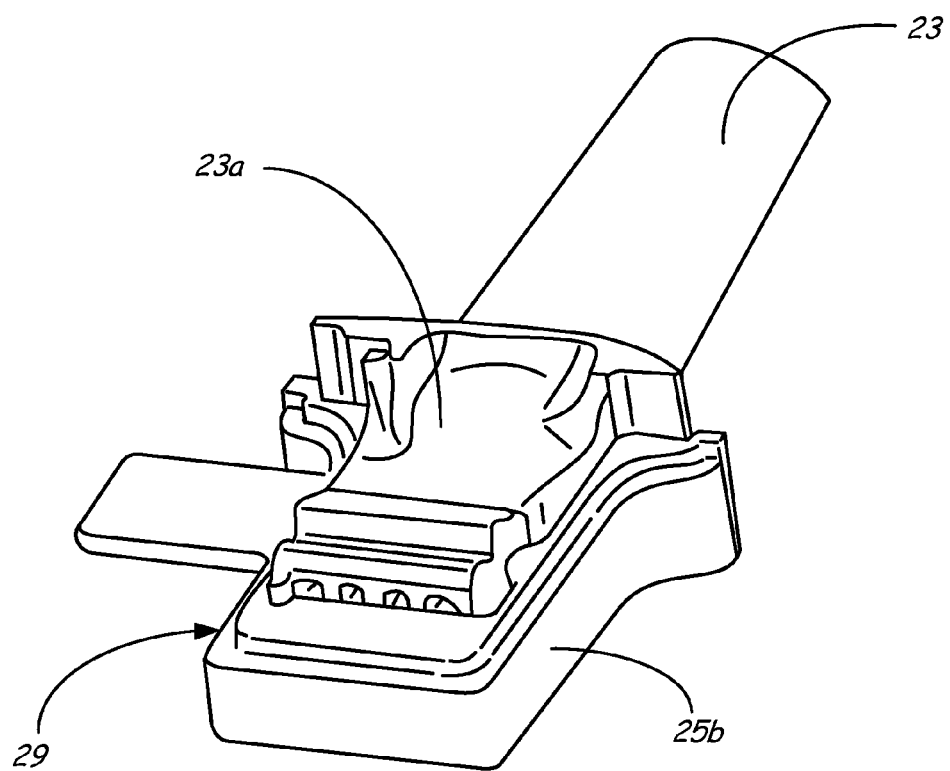
FIG. 4 is a perspective view showing a blade with one half section of the masking device.

FIG. 4 shows mask half 25b holding blade 23 and illustrating how root 23a of blade 23 is enclosed in mask half 25b. Mask halves all include overlapping (ship lap) joint 29 such that each mask half includes mating raised and recessed portions forming a barrier to insure the areas not to be coated are protected.

Figure 5:
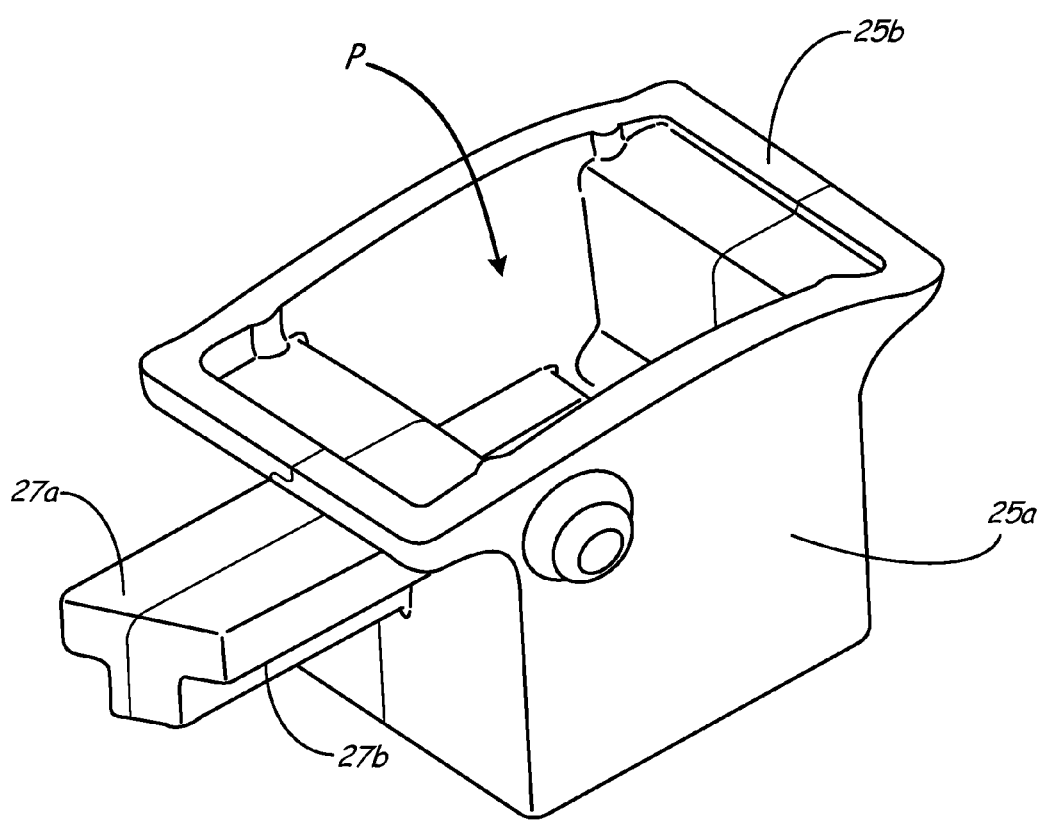
FIG. 5 is a partially exploded view of another feature of the invention.
Figure 6:
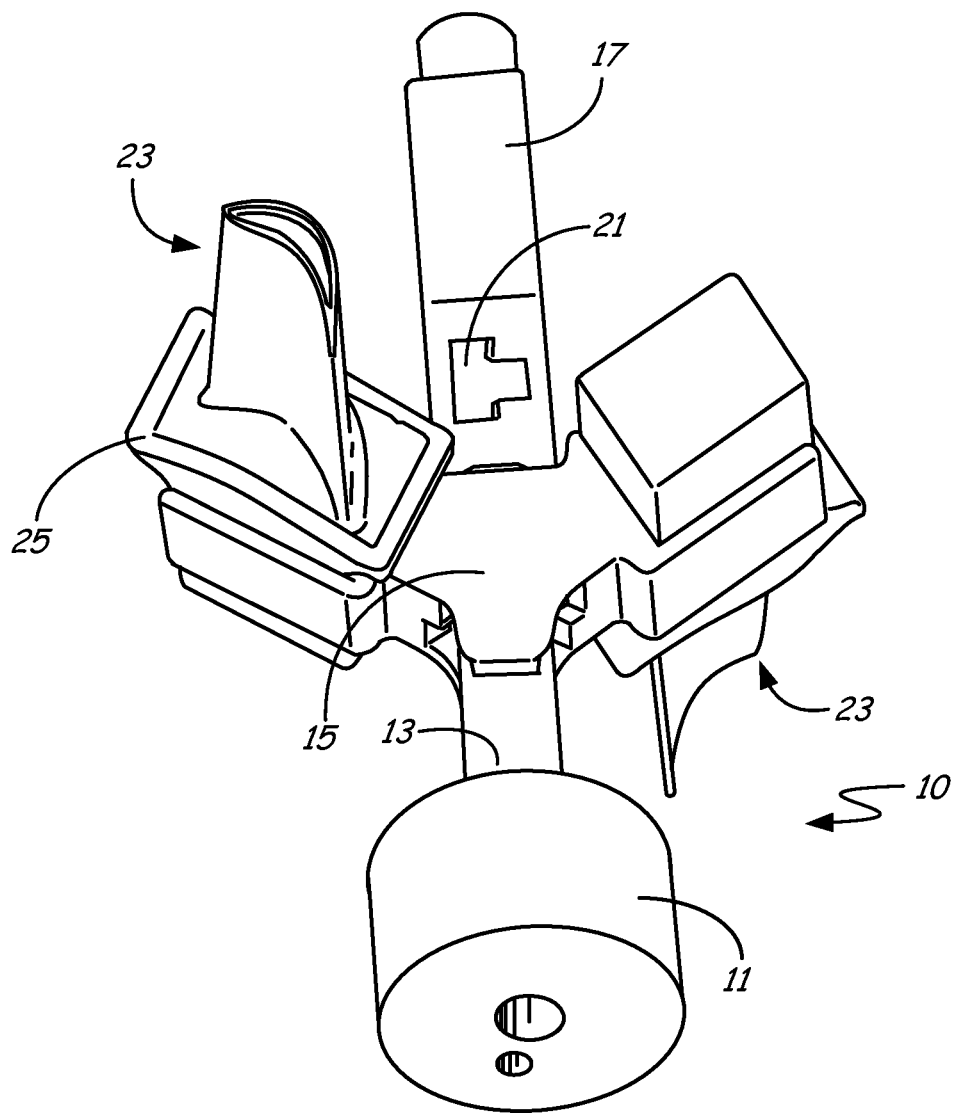
FIG. 6 is a perspective view of the holding tool with one blade holder removed.

FIG. 5 shows half masks 25a and 25b together without a blade. Pocket P, which holds root 23a, can be seen in FIG. 5. Half masks 25a and 25b are separated, blade 23 is inserted, masks 25a and 25b are fit together to enclose root portion 23a of blade 23. Plug or extension 27 is then inserted into hole or receptacle 21, seen as a through hole 21 in FIG. 6. Plug end 27 of blade masking tool 25 fits in hole 21 as a tight fit but does not require force to insert it or keep it in place. Hole 21 is a through hole to facilitate removal of plug 27 after the cathode arc coating process is complete, such as by tapping if necessary.

Holder 10 and half masks 25a and 25b are simple in structure, made by investment casting or other means, and are very easily cleaned and reused. Many parts can be processed with much simpler and quicker steps, which greatly increase throughput and decreases time to prepare for the next coating of additional parts. Holder 10 and blade masking tool 25 permit rapid placement of parts in position to be coated by cathodic arc deposition. Holder 10 and blade masking tool 25 can only be assembled in one orientation and blades 23 cannot go in backward. Blade 23 can be placed in holder 10 and blade masking tool 25 in twenty seconds or less, compared to prior art devices with fasteners that must be attached to the blade that may take minutes. When a large volume of blades are to be coated, this time savings is economically valuable.

Each mask includes an extension in the form of a key or plug to align the tooling with the holder and lock the blade into place. The key may be "T" shaped. The mask may be in the form of two mask halves sized to hold the portion of the part to be masked and expose the portion of the part to be coated. Each mask may also include a ship lap with male and female parts interlocking to ensure the areas not to be coated are protected. The mask and the holder tool are formed by investment casting. Insertion of the part into the masks and mounting on the holder tool takes very little time. The masks and holder tool are easily cleaned for the next use.

Although specifically illustrated as being used for coating turbine blades, the invention can be used for other parts that require coating of only certain portions of the parts.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

DISCUSSION OF POSSIBLE EMBODIMENTS

The following are nonexclusive descriptions of possible embodiments of the present invention.

Apparatus for holding parts while coating a portion of the parts includes a holder having a plurality of receptacles, each of which receives a part and supports it during coating. The part is held in a part holding mask sized to mask the portion of the part not to be coated and includes a plug sized to fit on one of the receptacles.

The apparatus of the preceding paragraph can optionally include additionally and/or alternatively, any one or more of the following features, configurations and/or additional components.

The receptacles may be through holes.

The part holding mask has a pair of masking halves sized to hold the portion of the part to be masked and expose the portion to be coated. The pair of masking halves include mating extensions forming the plug.

The plug may have a "T" shaped cross-section.

The pair of masking halves may also include overlapping joints surrounding the portion of the part to be masked to prevent it from being coated.

The holder includes a base for placement of the apparatus in a cathode arc coating unit.

A method for holding parts while coating a portion of the part by providing a holder having a plurality of holes and a part in a holding mask sized to mask a portion of the part while exposing the portion of the part to be coated. The mask has an extension sized to fit in one of the plurality of holes.

The method of the preceding paragraph can optionally include additionally and/or alternatively, any one or more of the following features, configurations and/or additional components.

The holes are through holes.

The part holding mask may have a pair of masking halves sized to hold a portion of the part to be masked and expose the portion to be coating. The pair of masking halve have mating extensions forming the extension to be pt on one of the holes.

The mating extensions form a "T" shape cross-section.

The pair of mating halves also include mating overlapping joints surrounding the portion of the part to be masked.

The holder has a base for placement in a cathode arc coating unit.

A device is provided for mounting parts in a holder formed from a part holding mask sized to mask a portion of the part not to be coated and a plug extending from the mask halves sized to fit in a hole on the holder.

The device of the preceding paragraph can optionally include additionally and/or alternatively, any one or more of the following features, configurations and/or additional components.

The holes in the holder are through holes.

The part holding mask has a pair of masking halves sized to hold the portion of the part to be masked and expose the portion of the part to be coating. The masking halves include mating extensions that form the plug.

The mating extensions form a "T" shape cross-section.

The pair of mating halves also include mating overlapping joints surrounding the portion of the part to be masked.

The holder with which the device is used has a base for placement in a cathode arc coating unit.

The invention claimed is:

1. An apparatus for holding parts while coating a portion of the parts, the apparatus comprising:
    a part holding mask for each part, the part holding mask sized to mask a first portion and expose a second portion of the part during a coating process and having a plug that extends from the part holding mask, with the plug having a body and an arm, wherein the arm projects outward from a side of the body; and
    a first holder having a plurality of receptacles, each receptacle for receiving the plug of one of the part holding masks and supporting the part holding mask and the part during the coating process.

2. The apparatus of claim 1, wherein the plurality of receptacles are through holes.

3. The apparatus of claim 1, wherein the part holding mask comprises a pair of masking halves sized to hold the first portion of the part to be masked and exposing the second portion of the part to be coated, the pair of masking halves having mating extensions forming the plug.

4. The apparatus of claim 3, wherein the body and the arm of the plug form a "T" shaped cross-section.

5. The apparatus of claim 3, wherein the pair of masking halves further include mating overlapping joints surrounding the portion of the part to be masked to prevent coating thereof.

6. The apparatus of claim 1, wherein the first holder includes a base for placement in a cathode arc coating unit.

7. A method for holding parts while coating a portion of the part, the method comprising:
    providing a holder having a plurality of holes;
    placing a part in a part holding mask sized to mask a first portion of the part and exposing a second portion of the part to be coated, the part holding mask having an extension sized to fit in one of the plurality of holes, the extension having a body and an arm that projects outward from a side of the body; and
    inserting the extension into one of the plurality of holes so that the part holding mask and the part are supported by the holder.

8. The method of claim 7, wherein the plurality of holes are through holes.

9. The method of claim 7, wherein the part holding mask comprises a pair of masking halves sized to hold the first portion of the part to be masked and expose the second portion of the part to be coated, the pair of masking halves having mating extensions forming the extension sized to fit in one of the plurality of holes.

10. The method of claim 7, wherein the body and the arm of the extension form a "T" shape cross-section.

11. The method of claim 9, wherein the pair of masking halves further include mating overlapping joints surrounding the portion of the part to be masked to prevent coating thereof.

12. The method of claim 7, wherein the holder has a base for placement in a cathode arc coating unit.

13. A device for mounting parts in a holder having a plurality of holes for use in supporting a part during a coating process, the device comprising:
   a part holding mask body sized to mask a first portion of the part not to be coated while exposing a second portion of the part; and
   a plug extending from the part holding mask body and sized to fit in one of the plurality of holes, the plug having a member and an arm protruding from a side of the member.

14. The device of claim 13, wherein the part holding mask body comprises a pair of masking halves sized to hold the first portion of the part and expose the second portion, the pair of masking halves having mating extensions that form the plug.

15. The device of claim 13, wherein the member and the arm of the plug form a "T" shape cross-section.

16. The device of claim 14, wherein the pair of masking halves further include mating overlapping joints surrounding the first portion of the part to be masked to prevent coating thereof.

17. The apparatus of claim 3, wherein each of the pair of masking halves includes one-half of the plug.

18. The apparatus of claim 1, wherein the first holder includes two receptacles arranged at 180 degrees from one another.

19. The apparatus of claim 18, further comprising:
   a second holder having two receptacles, each receptacle for receiving the plug of one of the part holding masks and supporting the part holding mask and the part during the coating process,
   wherein the first holder is adjacent to the second holder and the two receptacles of the first holder are perpendicular to the two receptacles of the second holder.

20. The apparatus of claim 1, wherein the part holding mask is configured to mask a root of an airfoil during the coating process.

* * * * *